United States Patent [19]

Eding

[11] Patent Number: 5,045,960
[45] Date of Patent: Sep. 3, 1991

[54] SELF-ALIGNING GUIDE AND TRACK FOR REMOVABLE DISK DRIVE MODULE

[75] Inventor: Lon Eding, Zeeland, Mich.

[73] Assignee: Zenith Data Systems Corporation, Buffalo Grove, Ill.

[21] Appl. No.: 365,322

[22] Filed: Jun. 13, 1989

[51] Int. Cl.$^5$ .................. G11B 17/02; G11B 31/00; G11B 5/02; H05K 7/16
[52] U.S. Cl. .................. 360/97.01; 360/137; 361/391; 361/394
[58] Field of Search ............ 360/97.01, 98.01, 99.06, 360/137; 361/390, 391, 394; 439/246, 248, 296, 374, 377, 378

[56]  References Cited

U.S. PATENT DOCUMENTS

| | | | |
|---|---|---|---|
| 2,514,246 | 7/1950 | Knox | 361/391 |
| 2,609,268 | 9/1952 | Nye | 361/391 |
| 2,735,965 | 2/1956 | Balanda | 361/391 |
| 2,944,864 | 7/1960 | Krivulka | 361/391 |
| 3,289,044 | 11/1966 | Ginsberg | 361/391 |
| 3,316,452 | 4/1967 | Barlow | 361/394 |
| 3,316,456 | 4/1967 | Barlow | 361/391 |
| 3,575,482 | 4/1971 | MacMaster et al. | 361/391 |
| 4,230,351 | 10/1980 | Bisbing | 292/223 |
| 4,272,794 | 6/1981 | Skarky | 360/99.06 |
| 4,633,350 | 12/1986 | Hanson | 360/98 |
| 4,688,131 | 8/1987 | Noda et al. | 360/137 |
| 4,717,982 | 1/1988 | Toreson et al. | 360/137 |
| 4,807,292 | 2/1989 | Sorscher | 360/137 |
| 4,853,807 | 8/1989 | Trager | 360/137 |
| 4,912,580 | 3/1990 | Hanson | 360/98.01 |
| 4,931,907 | 6/1990 | Robinson et al. | 361/391 |

OTHER PUBLICATIONS

PC Magazine, 9/13/88, "Removable Mass Storage: You Can Take it With You".

Primary Examiner—John H. Wolff
Assistant Examiner—Craig A. Renner
Attorney, Agent, or Firm—Dillis V. Allen

[57]  ABSTRACT

A slide guide for a removable computer drive module that permits the module to float as a self aligning connector engages. A computer housing has tracks that guide the module as it is inserted and release the forward end of the module just before the connector engages alignment pins that align the connector as it engages.

13 Claims, 5 Drawing Sheets

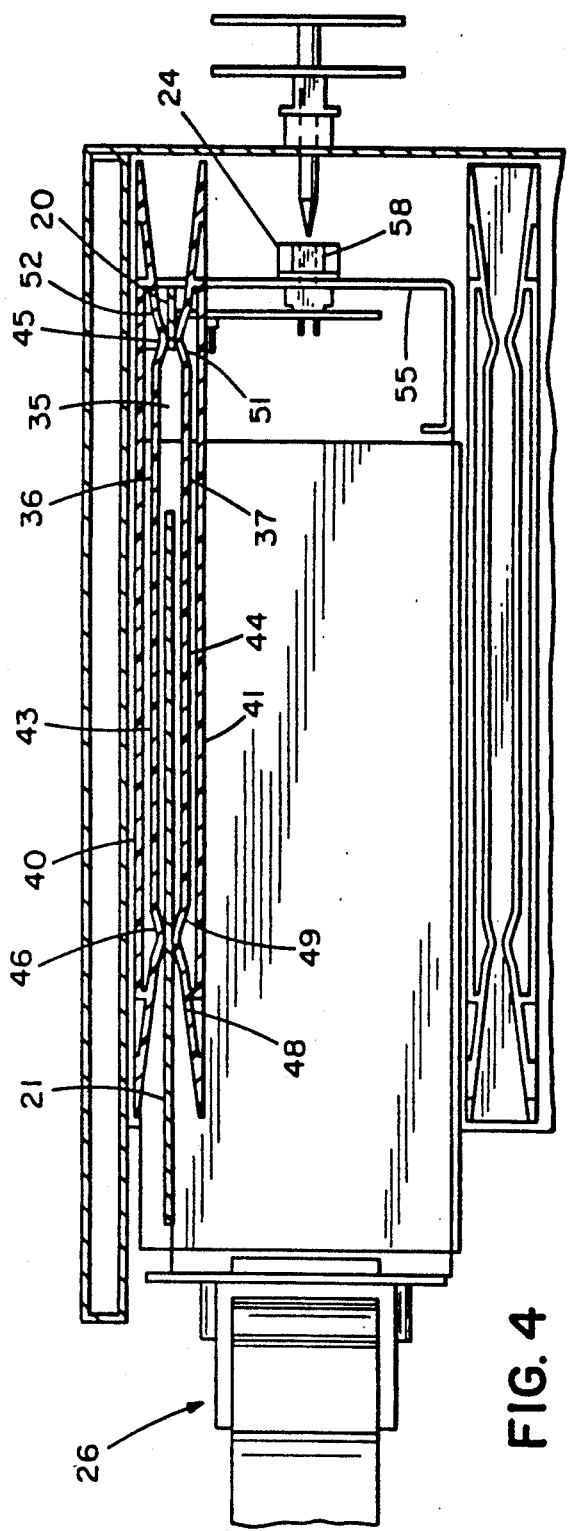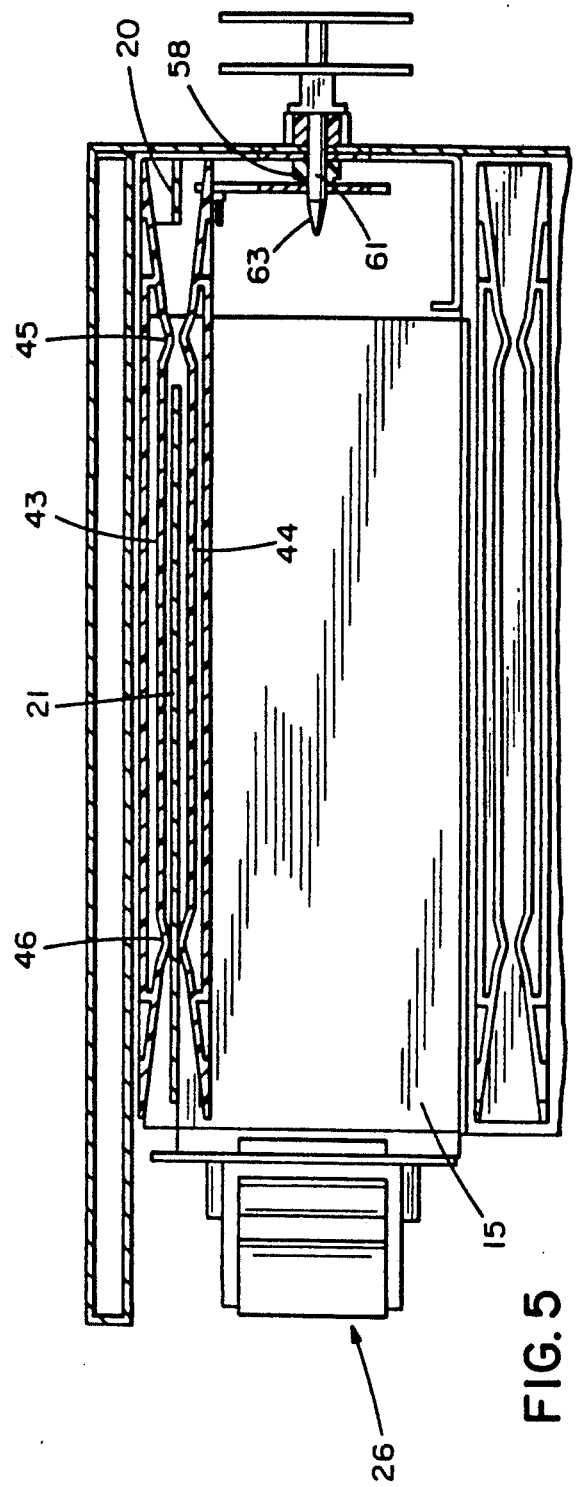

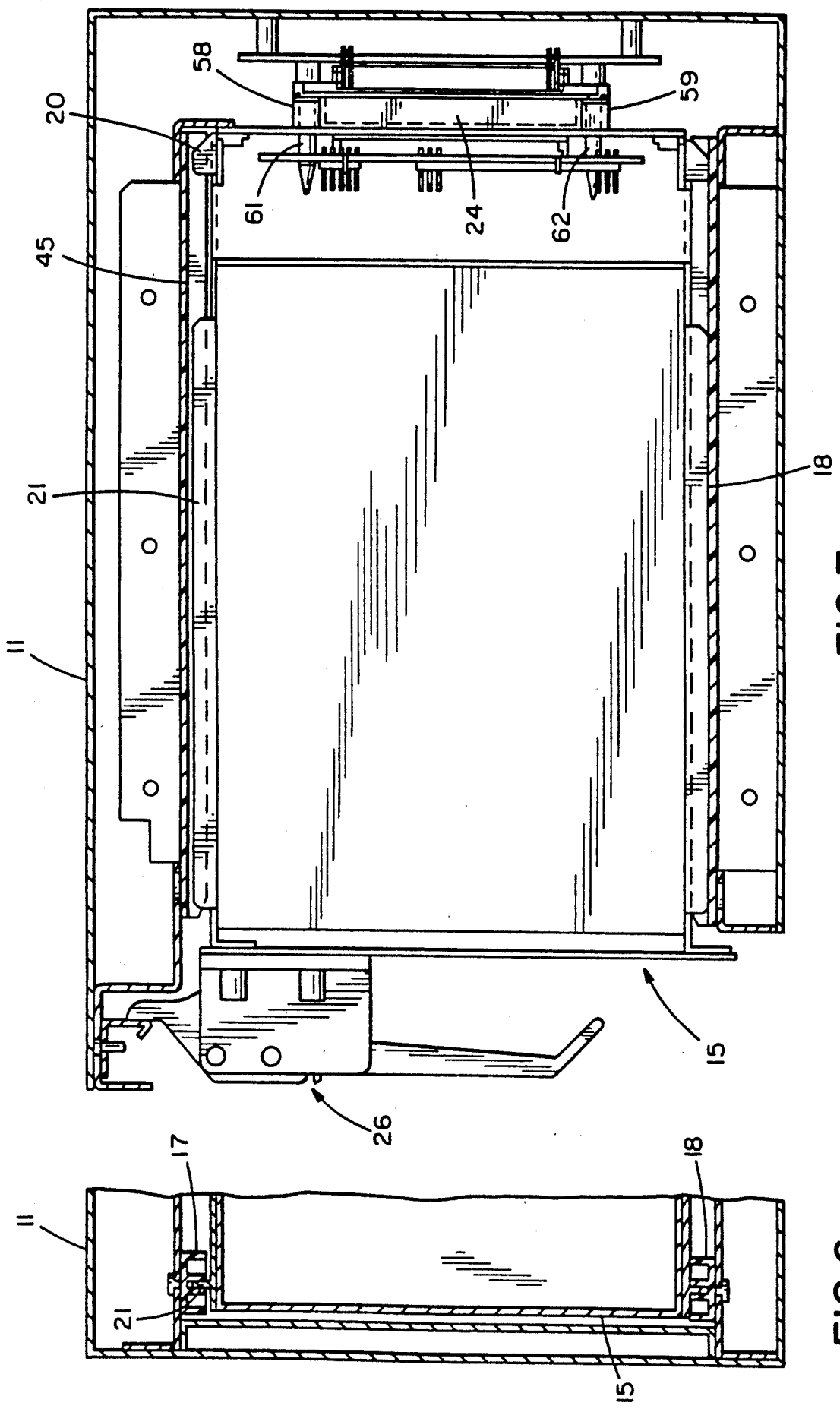

SELF-ALIGNING GUIDE AND TRACK FOR REMOVABLE DISK DRIVE MODULE

BACKGROUND OF THE INVENTION AND PRIOR ART

Removable computer drive modules have become increasingly popular not only for servicing the drive modules but for transferring data from one computer to another. These drive modules may contain one or a combination of one-half high drives, floppy or hard disks, including 3½ inch drives with adapters.

Since these modules are usually installed and removed by the operators of the computer, and not repair technicians, it is important that they have the capability of being easily installed without tools, and at the same time perfectly align and engage connectors interfacing the drive module and computer.

Thus, a successful drive-module installation mechanism must have the capability of engaging the module-computer connectors as the module is inserted and breaking the connection as the module is removed and accomplishing both of these tasks in a toolless manner without damaging the connectors in any way.

It should be understood that the present invention is not the first for removably attaching disk drives to computers, and several have been the subject of U.S. patents, including the Bisbing, U.S. Pat. No. 4,230,351; the Hanson, U.S. Pat. No. 4,633,350, and the Toreson, U.S. Pat. No. 4,717,982. These patents show lever system latching mechanisms that are satisfactory for many uses, but because lever systems have varying torque characteristics during latching, they lack the smooth operation necessary for easy operator use and also a constant level torque desirable for proper connector engagement and disengagement.

There are also a plurality of removable disk drives described in *PC Magazine*, Sept. 13, 1988, entitled "Removable Mass Storage: You Can Take It With You", but these have the same deficiencies described in the above U.S. patents.

There is also a U.S. patent application in the name of Horst Krenz, entitled "A Removable Hard Disk Drive Having a Combination Latch, Lever and Handle", U.S. Ser. No. 265,077, Filed Oct. 31, 1988, assigned to the assignee of the present invention that describes and shows a handle operated rack and pinion device on a removable hard drive module where a handle, pinion and rack are entirely mounted on the removable modules and operate a latching tongue that engages a cooperating stop adjacent the computer housing opening. In this latching mechanism, the rack and pinion arrangement is continuously engaged. This module latching system is suitable for many purposes, particularly where a handle is desired for carrying the module, but in some cases it overly complicates the module assembly.

There is another U.S. patent application assigned to the assignee of the present invention filed in the name of Horst Krenz entitled "Installation Mechanism for Removable Computer Drive Modules", U.S. Ser. No. 306,613, filed Feb. 3, 1989, that discloses guide rails for removably receiving a drive module that carry rack teeth engaging pinions on a locking handle that serve to engage the module connector as the drive module is slid into the computer housing.

It is a primary object of the present invention to ameliorate the problems noted above in installation mechanisms for removable drive modules.

SUMMARY OF THE PRESENT INVENTION

In accordance with the present invention, a computer component is provided having a removable drive module with an interengaging guide system that releases the forward end of the drive module as it approaches connector engagement so an alignment mechanism can precisely align a connector on the forward end of the drive module with a stationary connector in the housing as they engage.

This guiding and alignment system virtually eliminates the possibility of connector misalignment during engagement that heretofore has created a substantial problem of connector pin damage.

Toward these ends, an opening in the drive is provided with identical upper and lower tracks that have spaced forward and rear sets of converging and diverging walls that slidably receive short flat forward guides and aligned elongated rear guides on the top and bottom of the drive module. As the drive module is inserted into these guide tracks, the short forward module guides pass through and are aligned sequentially by the forward and rear track convergences while the elongated rear module guides are aligned only by the track rear convergences.

The stationary connector in the computer drive opening is provided with a pair of tapered guide pins that fit into corresponding openings adjacent the drive module connector to precisely align the connectors as they engage. The track forward convergences are positioned so that as the short forward module guides pass therethrough, the forward end of the module is free to float, and the alignment pins then take over to precisely align the forward end of the module and the connectors as they engage.

This final positioning and engagement of the connectors is effected by a rack and pinion mechanism similar to the one described in the above-mentioned U.S. patent application, Ser. No. 265,077.

Other objects and advantages of the present invention will appear more clearly from the following detailed description.

BRIEF DESCRIPTION OF THE DRAWINGS

FIG. 4 is a longitudinal section illustrating the guide track and guides taken generally along line 4—4 of FIG. 2;

FIG. 5 is a longitudinal section similar to FIG. 4 with the drive module fully inserted and locked;

FIG. 6 is a fragmentary section taken generally along line 6—6 of FIG. 2 showing the track rear convergences engaging and aligning the drive module rear guides, and;

FIG. 7 is a longitudinal section through the computer component showing the drive module fully engaged and locked.

DETAILED DESCRIPTION OF THE PREFERRED EMBODIMENT

Figure 1:
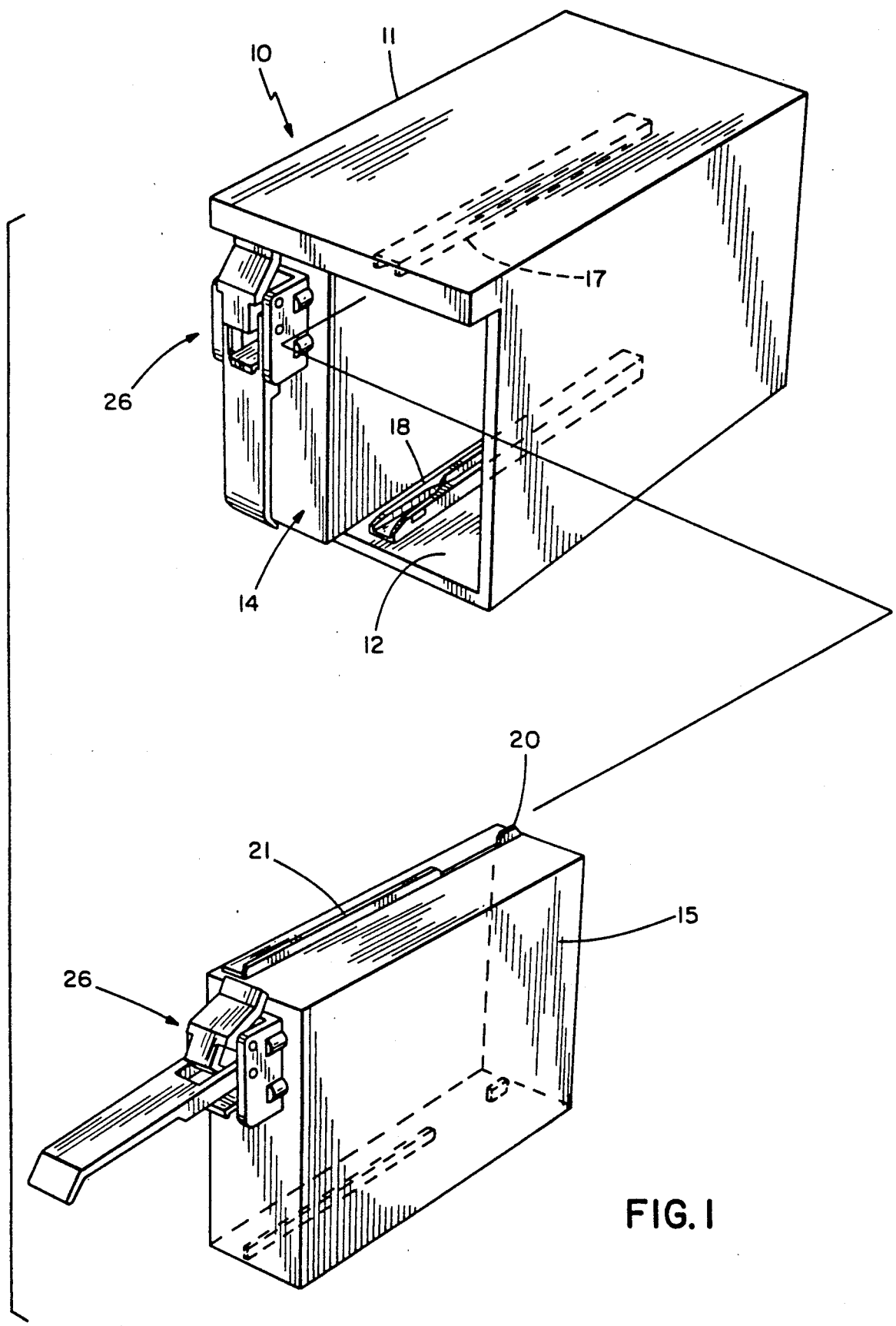
FIG. 1 is an exploded view of a dual drive component with one drive module inserted and the other in preparation for insertion, according to the present invention.
Figure 2:
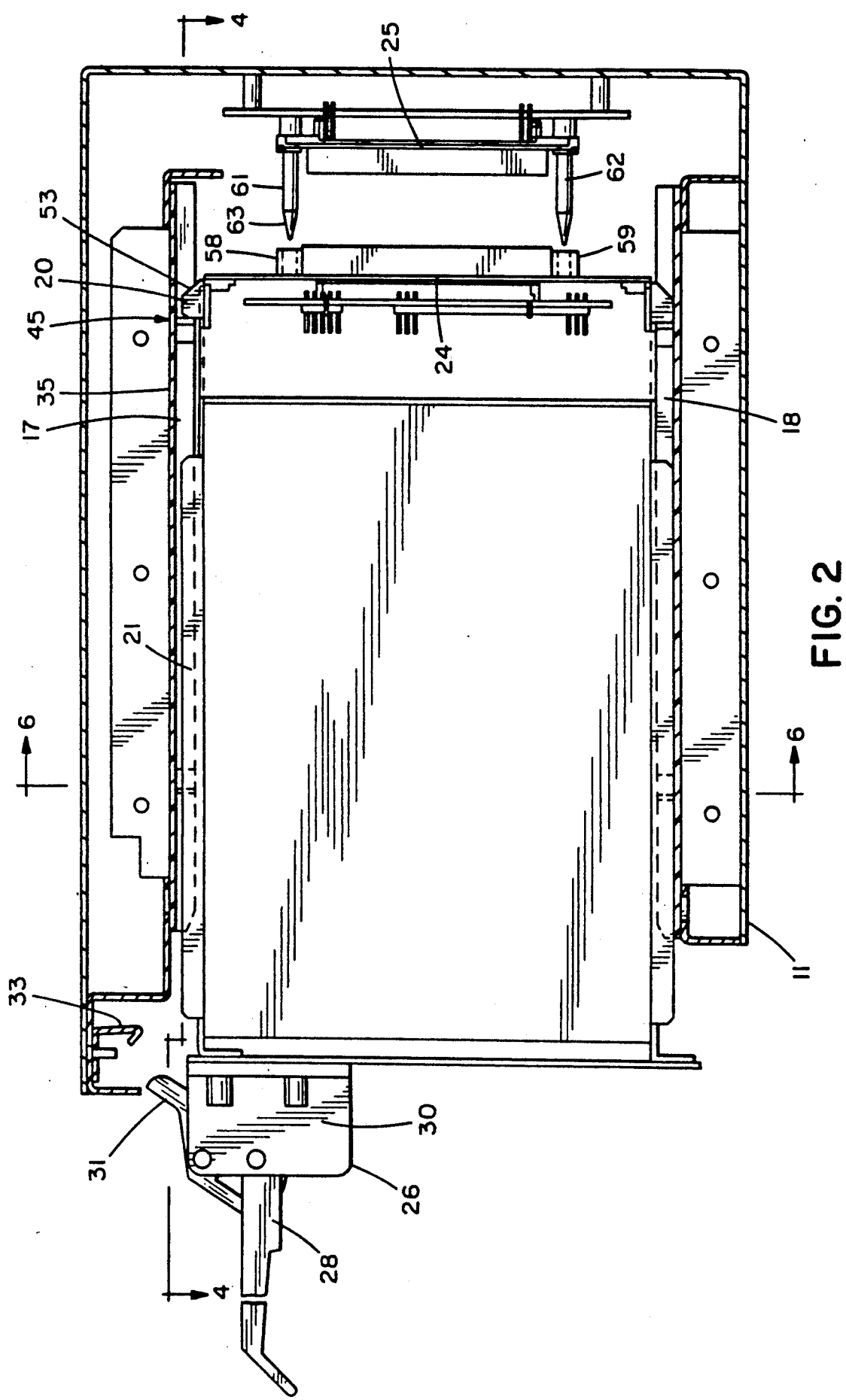
FIG. 2 is a longitudinal section through one of the drive modules just prior to connector engagement with its latching handle mechanism unlocked.
Figure 3:
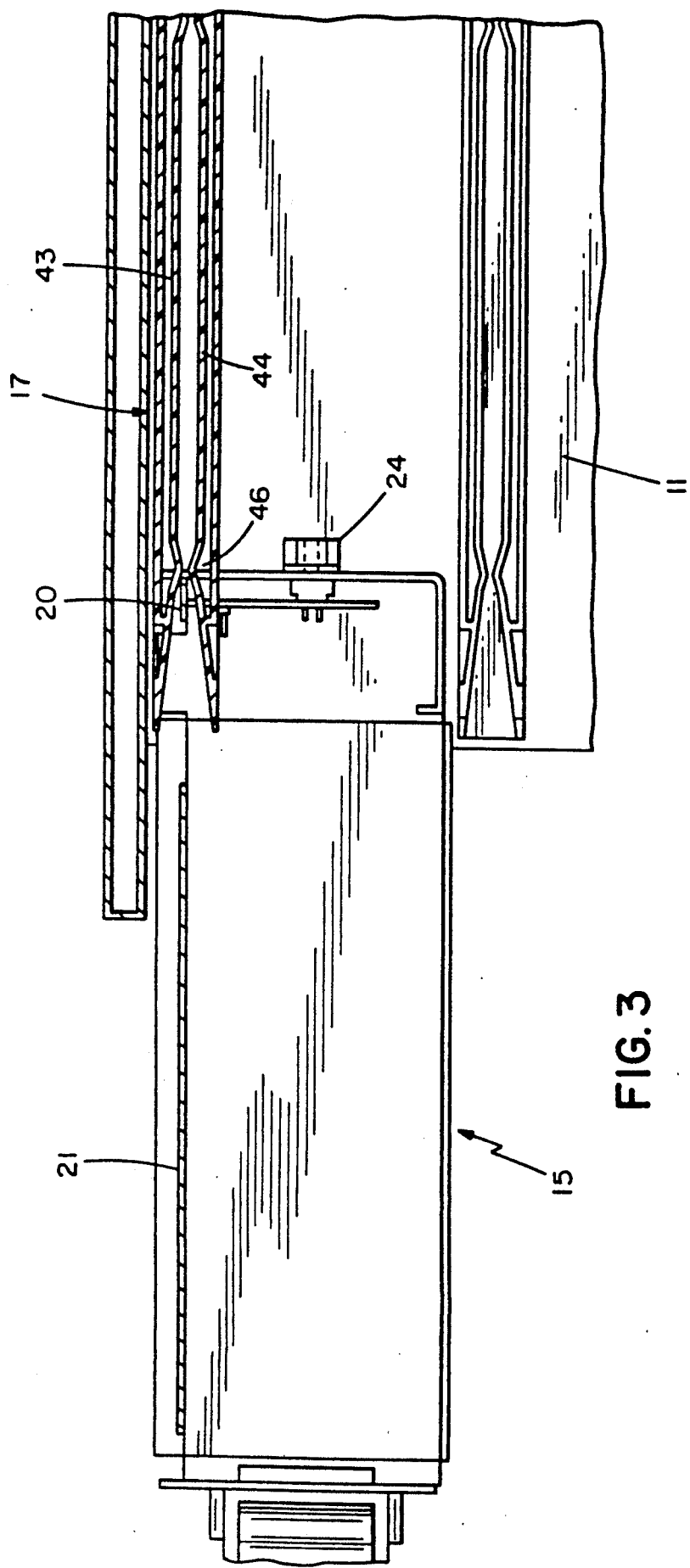
FIG. 3 is a fragmentary top view of one of the guide tracks as the module short forward projections are being aligned by the rear track convergences.

Referring to the drawings and particularly FIGS. 1 and 2, a dual drive computer component 10 is illustrated according to the present invention including a housing 11 having a dual slotted opening 12 therein adapted to receive identical parallel spaced drive modules 14 and 15 with drive module 14 shown fully inserted and locked in housing 11 and module 15 in preparation for insertion.

Each of the drive modules 14 and 15 are guided into the housing 11 by upper and lower guide tracks 17 and 18 that cooperate with a pair of short flat guides 20 on the forward end of the module and aligned flat elongated guides 21 spaced rearwardly from forward guides 20.

The forward end of the drive modules carries a pin connector 24 that engages with a cooperating pin connector 25 fixed within the rear of the housing opening 12, and these connectors provide the terminal interface between the drive modules and the associated computer.

The connectors 24 and 25 are engaged by a latching mechanism 26 similar to that described in the above-mentioned U.S. patent application, Ser. No. 265,077, and is seen to include a pivotal handle 28 that drives a rack and pinion assembly within latch housing 30 that in turn pivots a latching tongue 31 that engages behind a housing mounted flange 33 as the handle 28 is pivoted downwardly. This action effects the final insertion movement of the drive module and effects the engagement of connectors 24 and 25.

Bearing in mind that each of the tracks 17 and 18 is identical and referring to FIGS. 2 to 5, the tracks are a one piece nylon molding having a base wall 35 with projecting side walls 36 and 37. Side walls 36 and 37 are connected near their ends to parallel outer walls 40 and 41 also connected to base wall 35 that serve to support side walls 36 and 37.

Side walls 36 and 37 have straight parallel central portions 43 and 44, a forward converging portion 45 and a rear converging portion 46. The rear converging portion 46 is defined by an elongated converging entrance wall portion 48 and a short diverging exit wall portion 49, and forward converging portion 45 is defined by a short converging wall portion 51 and an angularly stepped elongated diverging wall portion 52.

The walls 36 and 37 are spaced apart at the converging portions 45 and 46 slightly more than the thickness of the module guide projections 20 and 21 so that as the module is inserted the guides 20 and 21 pass through walls 36 and 37 at converging portions 45 and 46.

The guides 20 and 21 are fixed to the top and bottom of the drive module and are aluminum extrusions. As seen in FIG. 2, the forward guide projections 20 have a tapered leading wall 53 that prevents these projections from hanging up as the drive module is initially inserted into opening 12.

The connector 24 is carried by a frame 55 fixed to the forward end of the drive module and adjacent thereto are a pair of bosses 58 and 59 that have openings positioned to receive locating pins 61 and 62 both of which have conical forward ends 63 that enter and slide into the boss openings as the module is moved from its position illustrated in FIG. 2 to its position illustrated in FIGS. 5 and 7.

Pins 61 and 62 and bosses 58 and 59 are precisely positioned with respect to the connectors 24 and 25 so that they perfectly align the connectors just prior to and during engagement.

As the drive module 15 is inserted into the housing 11, the forward projections 20 enter the tracks 17 and 18 and are initially aligned by the track rear convergence 46. This initial alignment of the module assures a smooth entry of the rear guide 21 through the rear convergence 46. Thereafter, the module is guided by the rear convergence 46 and the rear guide 21 and central portions 43 and 44 limit module lateral swing. Then, as the forward guide 20 enters the forward convergence 45, the forward end of the drive module is aligned so that the locating pins 61 and 62 are roughly aligned with the openings in bosses 58 and 59.

As the forward projections 20 exit the convergences 45, diverging side wall portions 52 begin to release the projections 20 permitting the forward end of the module to float in a restricted manner just after the conical portions 63 enter the openings in bosses 58 and 59. Therefore, further alignment of the forward end of the module is under the control of the locating pins 61 and 62.

The operator then grasps handle 28 and rotates it downwardly to its latched position which shifts the drive module to its locked position illustrated in FIG. 7 during which time the locating pins 61 and 62 accurately and precisely align the connectors 24 and 25.

It should be noted that while the diverging wall portions 52 release the projections 20 in a horizontal plane thereby permitting the forward end of the module to float laterally somewhat, there is also a limited amount of vertical play between tracks 17 and 18 and the guides 20 and 21 so as the guide pins 61 and 62 take control of forward alignment, they effect alignment in both orthogonal planes, i.e., horizontally and vertically.

What is claimed is:

1. A computer component with a removable disk drive module, comprising: a computer component housing including an opening with stationary guide means, a terminal connector in the housing opening at its inner end, said drive module removably received in the housing opening and having guides interengageable with the stationary guide means, a connector fixed to a forward end of the drive module releasably engageable with the housing terminal connector, and an installation assembly for engaging the two connectors to hold the drive module in position in the housing, said stationary guide means in the housing and the drive module guides constructed to guide the drive module as it is inserted into the housing and including means to release a forward portion of the module relative to the housing just prior to connector engagement so that the forward end of the drive module is free to move in at least one orthogonal direction just prior to connector engagement, and alignment means adjacent to and separate from the connectors and separate from the drive module guides and the stationary guide means for aligning the connectors as the forward portion of the drive module is released by the stationary guide means.

2. A computer component with a removable disk drive module as defined in claim 1, wherein the installation assembly includes a handle-operated-interengaging drive on the housing and the drive module.

3. A computer component with a removable disk drive module as defined in claim 1, wherein the stationary guide means on the housing includes a stationary track on the housing and the module guides include at least one guide projection on the module engageable with the track, said track being interrupted at its forward end so that it releases the module guide projection and permits the forward end of the module to be free to move in at least one orthogonal direction as it approaches connector engagement.

4. A computer component with a removable disk drive module as defined in claim 3, wherein the stationary guide means includes a track with forward and rear spaced converging portions, the module guides including forward and rear spaced guide projections on the drive module both of which pass through the rear spaced converging portion as the drive module is slid into the housing opening and the forward spaced guide projection passes through the forward spaced converging portion just prior to connector engagement.

5. A computer component with a removable disk drive module as defined in claim 4, wherein the forward spaced converging portion has a diverging exit portion that releases the drive module forward spaced guide projection in one orthogonal direction.

6. A computer component with a removable disk drive module as defined in claim 1, wherein the alignment means includes at least one guide pin adjacent the connectors on one of the housing and the drive module to finally align the connectors just prior to engagement.

7. A computer component with a removable disk drive module, comprising: a computer component housing including an opening with stationary guide means, a terminal connector in the housing opening at its inner end, said drive module removably received in the housing opening and having guides interchangeable with the stationary guide means, a connector fixed to a forward end of the drive module releasably engageable with the terminal connector, an installation assembly for engaging the two connectors to hold the module in position in the housing, said stationary guide means in the housing and the module guides constructed to guide the drive module as it is inserted into the housing and including means to release a forward portion of the module relative to the housing just prior to connector engagement so that the forward end of the drive module is free to move in at least one orthogonal direction just prior to connector engagement, and final alignment means separate from the module guides and the stationary guide means and adjacent and separate from the connectors on the housing and the drive module to finally align the connectors just prior to engagement and after release by the stationary guide means.

8. A computer component with a removable disk drive module, as defined in claim 7, wherein the final alignment means includes at least one locating pin and a complementary receiving aperture.

9. A computer component with a removable disk drive module, comprising: a computer component housing including an opening with stationary guide means, a terminal connector in the housing opening at its inner end, said drive module removably received in the housing opening and having guides interchangeable with the stationary guide means, a connector fixed to a forward end of the drive module releasably engageable with the terminal connector, an installation assembly for engaging the two connectors to hold the drive module in position in the housing, said stationary guide means in the housing and the module guides constructed to guide the drive module as it is inserted in the housing and including means to release a forward portion of the module relative to the housing just prior to connector engagement so that the forward end of the module is free to move in at least one orthogonal direction prior to engagement, said stationary guide means including a track on the housing and said module guides including at least a forward projection on the forward end of the drive module engageable with the track, said track having a forward end and being interrupted at its forward end so that it releases the drive module forward projection just prior to connector engagement, and at least one guide pin adjacent and separate from the connectors on one of the housing and the drive module to finally align the connectors just prior to engagement and after the drive module forward projection is released by the track.

10. A computer component with a removable disk drive module as defined in claim 9, wherein the installation assembly includes a handle-operated-interengaging drive on the housing and module.

11. A computer component with a removable disk drive module as defined in claim 9, wherein the track has forward and rear spaced converging portions, said module guides including a rear projection spaced from the forward projection on the drive module both of which pass through the rear spaced converging portion as the module is slid into the housing opening and the forward projection passes through the forward spaced converging portion just prior to connector engagement.

12. A computer component with a removable disk drive module as defined in claim 10, wherein the forward spaced converging portion has a diverging exit portion that releases the drive module forward projection in at least one orthogonal direction.

13. A computer component with a removable disk drive module, comprising: a computer component housing including an opening with stationary guide means, a terminal conductor in the housing opening at its forward end, said drive module removably received in the housing opening and having guides interengageable with the stationary guide means, a connector fixed to a forward end of the drive module releasably engageable with the terminal connector, an installation assembly for engaging the two connectors to hold the module in position in the housing, said stationary guide means in the housing and the module guides constructed to guide the drive module as it is inserted into the housing and including means to release a forward portion of the module relative to the housing so that the forward end of the drive module is free to move in at least one orthogonal direction just prior to connector engagement, said stationary guide means including a track on the housing and said module guides including at least a forward projection on the forward end of the drive module engageable with the track, said track having a forward end and being interrupted at its forward end so that it releases the module forward projection just prior to connector engagement, the track having forward and rear spaced converging portions, said drive module guides including a rear guide projection spaced from the forward projection on the drive module both of which pass through the rear spaced converging portion as the drive module is slid into the housing opening and the forward projection passes through the forward spaced converging portion just prior to connector engagement, said forward spaced converging portion having a diverging exit portion that releases the module forward projection in at least one orthogonal direction, and at least one guide pin adjacent and separate from the connectors on one of the housing and the module to finally align the connectors just prior to engagement and after the module forward projection is released by the stationary guide means.

* * * * *